United States Patent
Douglas et al.

(10) Patent No.: US 7,756,229 B2
(45) Date of Patent: Jul. 13, 2010

(54) APPARATUS AND METHOD FOR ADJUSTING FILTER FREQUENCY IN RELATION TO SAMPLING FREQUENCY

(75) Inventors: Robert Douglas, Ballymena (GB); Geoffrey McCullough, Portadown (GB)

(73) Assignee: OPTIMUM Power Technology, L.P., Bridgeville, PA (US)

( * ) Notice: Subject to any disclaimer, the term of this patent is extended or adjusted under 35 U.S.C. 154(b) by 0 days.

(21) Appl. No.: 11/652,285

(22) Filed: Jan. 11, 2007

(65) Prior Publication Data

US 2007/0116167 A1    May 24, 2007

Related U.S. Application Data

(63) Continuation of application No. 10/086,900, filed on Mar. 1, 2002, now abandoned.

(60) Provisional application No. 60/273,126, filed on Mar. 3, 2001.

(51) Int. Cl.
H04B 1/10 (2006.01)
(52) U.S. Cl. .................................................. 375/350
(58) Field of Classification Search ................. 375/350, 375/355, 376; 327/144, 145, 147; 331/13
See application file for complete search history.

(56) References Cited

U.S. PATENT DOCUMENTS

| | | | |
|---|---|---|---|
| 4,426,641 A * | 1/1984 | Kurihara et al. | 340/683 |
| 4,488,240 A * | 12/1984 | Kapadia et al. | 702/56 |
| 4,553,109 A * | 11/1985 | Hyatt | 331/25 |
| 4,620,313 A | 10/1986 | Erker | |
| 4,646,004 A * | 2/1987 | Brandt et al. | 324/76.53 |
| 4,694,687 A * | 9/1987 | Bonin et al. | 73/116 |
| 4,763,207 A * | 8/1988 | Podolak et al. | 360/32 |
| 4,881,174 A * | 11/1989 | Gimmler | 702/78 |
| 4,934,196 A * | 6/1990 | Romano | 73/861.356 |
| 4,987,373 A * | 1/1991 | Soo | 327/145 |
| 5,710,714 A | 1/1998 | Mercadal et al. | |
| 5,809,451 A * | 9/1998 | Parsons et al. | 702/190 |
| 5,842,158 A * | 11/1998 | Plasek | 702/195 |
| 5,845,236 A * | 12/1998 | Jolly et al. | 702/195 |
| 5,884,245 A * | 3/1999 | Chandler | 702/189 |
| 5,900,830 A * | 5/1999 | Scheffler | 341/123 |
| 5,937,013 A * | 8/1999 | Lam et al. | 375/340 |
| 5,991,349 A * | 11/1999 | Chen | 375/355 |
| 6,032,109 A * | 2/2000 | Ritmiller, III | 702/104 |

(Continued)

FOREIGN PATENT DOCUMENTS

EP    0 952335 A1 *    10/1999

(Continued)

*Primary Examiner*—Young T. Tse
(74) *Attorney, Agent, or Firm*—Richard W. James

(57) ABSTRACT

A self-tuning filter is disclosed. The self-tuning filter includes a digital clocking signal and an input coupled to the digital clocking signal, whereby the input reads a value incident on the input when the digital clocking signal changes to a predetermined state. A clock-tunable filter is, furthermore, coupled to the digital clocking signal so that the frequency of the clock-tunable filter is adjusted in relation to a sampling frequency at which the digital clocking signal operates. The self-tuning filter may be applied to an input of a data acquisition unit and applied to an input having a variable sampling frequency. A method of controlling the frequency of a clock-tunable filter is also disclosed.

20 Claims, 5 Drawing Sheets

U.S. PATENT DOCUMENTS

| | | | |
|---|---|---|---|
| 6,041,028 A | * 3/2000 | Quan et al. | 369/44.34 |
| 6,047,601 A | * 4/2000 | Foster | 73/602 |
| 6,098,022 A | * 8/2000 | Sonnichsen et al. | 702/35 |
| 6,129,746 A | * 10/2000 | Levine et al. | 607/27 |
| 6,138,504 A | 10/2000 | Lewis et al. | |
| 7,024,059 B2 | * 4/2006 | Kurchuk | 385/12 |

FOREIGN PATENT DOCUMENTS

| | | |
|---|---|---|
| JP | S63-026033 A | 2/1988 |
| JP | S63-061817 U | 3/1988 |
| JP | H02-047912 A | 2/1990 |

* cited by examiner

APPARATUS AND METHOD FOR ADJUSTING FILTER FREQUENCY IN RELATION TO SAMPLING FREQUENCY

CROSS-REFERENCE TO RELATED APPLICATIONS

This application is a continuation of U.S. application Ser. No. 10/086,900, filed Mar. 1, 2002, now abandoned, which claims the benefit of U.S. Provisional Application No. 60/273,126, filed Mar. 3, 2001.

STATEMENT REGARDING FEDERALLY SPONSORED RESEARCH

Not applicable.

BACKGROUND OF THE INVENTION

1. Field of the Invention

The disclosed invention relates to filter systems in general and, in particular, to a self-tuning filter for data acquisition.

2. Description of the Background

It is known that the acquisition of data at high sampling rates, typically greater than 5000 samples per second, is a difficult process and that the sampled data is very prone to sampling error due to noisy signals. Such noise is an inherent problem in many applications such as in internal combustion engines. That noise can lead to what is called "aliasing" which is caused by interference of the noise frequency with the sampling frequency. An aliased signal is a false signal that results from a sampling rate that is less frequent than desirable. Where a sensed condition changes very rapidly, it may be difficult or impossible to sense the condition at a frequency that eliminates aliasing.

To resolve the aliasing problem in such circumstances, it is common to filter the signal by applying a low-pass filter to the signal between the sensing device and the data acquisition device. Such a low-pass filter may be setup as an "anti-aliasing" filter by setting a filter corner frequency of the anti-aliasing filter at half of the sampling frequency. Such filtering, however, introduces additional problems as the filtering process delays the signal causing a timing mismatch. To resolve the timing mismatch, it is preferable to have a programmable filter controlled by the data acquisition unit so that the data acquisition unit can control the level of filtering being applied and compensate for the timing mismatch associated with the corner frequency set at the anti-aliasing filter.

The approach of using a programmable anti-aliasing filter is complicated, however, if the sampling frequency changes with time, such as in the situation of degree-of-rotation based sampling of an engine operating characteristic during transient operation. In such a case, the filter frequency needs to change to match the changing sampling frequency to maintain measurement accuracy.

Thus, there is a need for an adjustable low-pass filter system that can follow a changing sampling frequency.

There is a further need for a digital frequency multiplier that has improved operating characteristics over a phase-lock loop.

Accordingly, the present invention provides solutions to the shortcomings of prior input filtering devices and frequency multiplying devices. Those of ordinary skill in the art will readily appreciate, therefore, that those and other details, features, and advantages will become further apparent in the following detailed description of the preferred embodiments.

SUMMARY OF THE INVENTION

The present invention is directed to a self-tuning filter. The self-tuning filter includes a digital clocking signal and an input coupled to the digital clocking signal, whereby the input reads a value incident on the input when the digital clocking signal changes to a predetermined state. A clock-tunable filter is, furthermore, coupled to the digital clocking signal so that the frequency of the clock-tunable filter is adjusted in relation to a sampling frequency at which the digital clocking signal operates. The self-tuning filter may be applied to an input of a data acquisition unit and applied to an input having a variable sampling frequency.

The present invention is also directed to a method of controlling the frequency of a clock-tunable filter. That method includes sensing a frequency at which a digital clocking signal changes state and adjusting a frequency of the clock-tunable filter in relationship to the frequency at which the digital clocking signal changes state. In that method, the digital clocking signal causes an input to read a value incident on the input when the digital clocking signal changes to a predetermined state. That method is particularly applicable to acquiring data having a varying sampling rate at a data acquisition unit.

Thus, the present invention provides a method, apparatus and system of accurately reading an input having a changing sampling frequency.

The present invention also provides a method, apparatus and system whereby a low-pass filter follows an input having a changing sampling frequency.

Furthermore, the present invention beneficially provides a digital frequency multiplier that has improved operating characteristics over a phase-lock loop.

Accordingly, the present invention provides solutions to the shortcomings of prior filters. Those of ordinary skill in the art will readily appreciate, therefore, that those and other details, features, and advantages will become further apparent in the following detailed description of the preferred embodiments.

BRIEF DESCRIPTION OF THE DRAWINGS

The accompanying drawings, wherein like reference numerals are employed to designate like parts or steps, are included to provide a further understanding of the invention, are incorporated in and constitute a part of this specification, and illustrate embodiments of the invention that together with the description serve to explain the principles of the invention.

In the drawings.

DETAILED DESCRIPTION OF THE INVENTION

Figure 1:
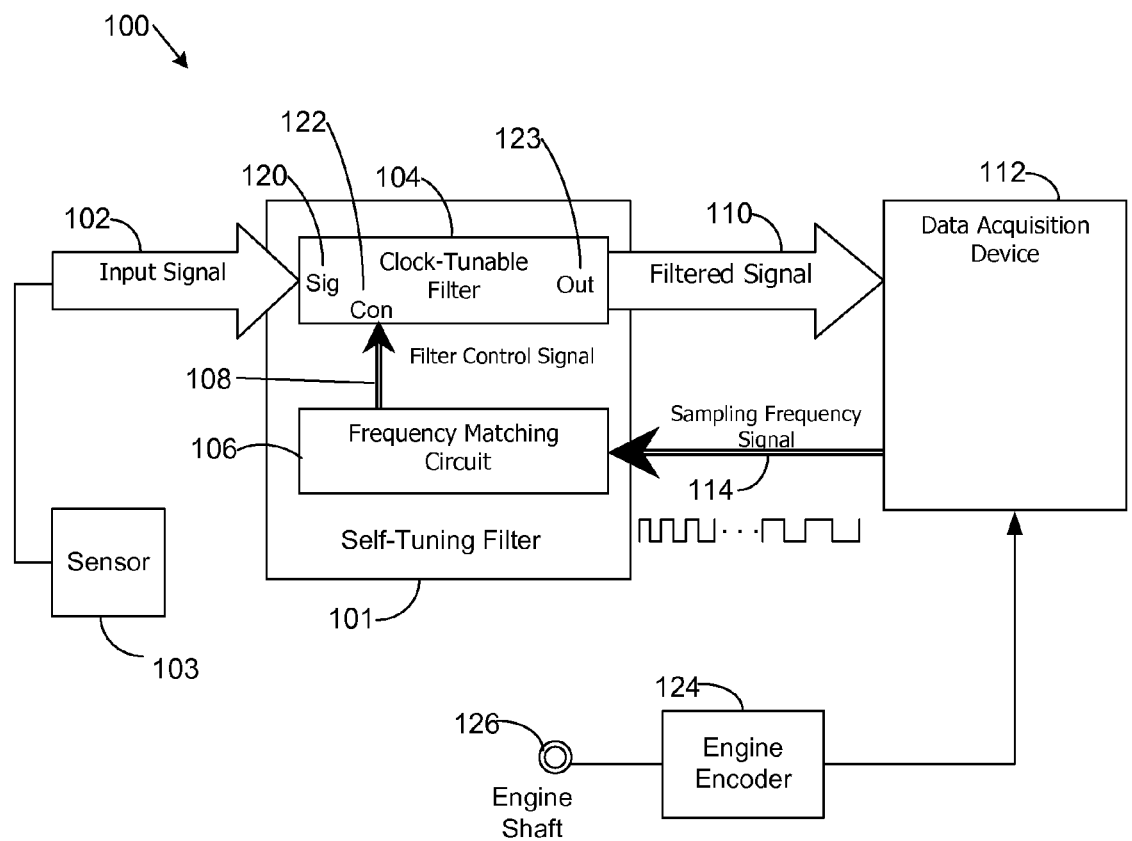
FIG. 1 is a schematic illustration of a clock-tunable filter of the present invention as applied to a data acquisition application.

It is to be understood that the figures and descriptions of the present invention included herein illustrate and describe elements that are of particular relevance to the present invention, while eliminating, for purposes of clarity, other elements found in typical data acquisition systems. Because the construction and implementation of such other elements are well known in the art, and because a discussion of them would not facilitate a better understanding of the present invention, a discussion of those elements is not provided herein. It is also to be understood that the embodiments of the present invention that are described herein are illustrative only and are not exhaustive of the manners of embodying the present invention. For example, it will be recognized by those skilled in the art that the present invention may be readily adapted to provide a high quality filtered signal in many applications other than internal combustion engine sensing applications.

The disclosed invention provides a method and apparatus for adjusting filter frequency as a function of sampling frequency. Initially, a method and apparatus for adjusting the frequency at which a low-pass filter operates in response to a changing sampling frequency is provided. The invention utilizes a "self-tuning filter" that comprises a clock-tunable filter and a frequency matching device.

The filter is placed intermediate a sensor and an input of a data acquisition unit to act upon a signal provided by the sensor by removing high frequency noise that may be incident on, for example, a conductor carrying the signal. Signals below the frequency threshold at which the filter is set, which include signals in the frequency range provided by the sensor in a properly designed system, are permitted to pass through the filter to the input.

In certain circumstances, a sampling rate utilized by a data acquisition system may vary. For example, in degree-based sampling of an operating engine, wherein it is desired to sense properties and/or operating conditions such as the position, speed, or acceleration of an engine shaft each time the shaft rotates a predetermined number of degrees, the sampling rate will vary with the speed of the engine. Thus, when the engine is operating in a transient mode (i.e., the engine is accelerating or decelerating), the sampling rate will also vary.

When acquiring data, for example in connection with an operating internal combustion engine, electromagnetic noise is typically generated by the engine and may interfere with signals as they are transferred from the engine to the data acquisition unit. A low-pass filter or anti-aliasing filter is often used to remove high frequency noise from the signal prior to reading the signal at an input of the data acquisition unit. When utilizing a low-pass filter to remove high frequency noise, it is desirable to set the filter frequency as a function of the sampling frequency. For example, a filter corner frequency setting that is half of the sampling frequency is an appropriate ratio in many applications. Such a filter frequency will delay the signal by an amount approximately equal to the time between two samples. Furthermore, because filters cause signal receipt at the input to be delayed and because the amount of that delay is dependent upon the filter frequency, it is beneficial for the data acquisition unit to be aware of the filter frequency. Thus, when sampling a signal at a varying rate, it would be beneficial to change the filter frequency to maintain filter frequency at a constant ratio of the sampling frequency. In that way, the data acquisition unit can calculate the filter frequency from the sampling frequency and calculate the signal delay from the filter frequency. Thus, the present invention utilizes a tunable low-pass filter and provides a frequency matching input to the filter that is based on a frequency matching device output. Of course, the frequency matching device may include phased-lock loop technology that multiplies a frequency signal to provide the desired filter corner frequency. The manipulated frequency matching signal may then be applied to the filter.

A sampling clock having a clock controlling a digital output is commonly employed to operate a multiplexed input board of a data acquisition unit. The clock will cause the digital output to pulse at a desired sampling frequency. The digital output is furthermore coupled to the input board to operate sample and hold circuits on the input board. In that manner, each pulse is used to trigger the input board to sample an input and hold the value sensed at that input in a buffer where the value may be accessed by a processor portion of the data acquisition unit. The sampling rate is furthermore communicated between the processor and the clock and may be varied by the processor. Thus, the sampling clock may be utilized as a frequency matching device.

In the following example, the sampling clock acts as the frequency matching filter control device by providing its output signal to the clock-tunable filter. With a suitable design, the filter unit will then follow the sampling frequency, set to a constant ratio of that frequency, which may be half of the sampling frequency.

Referring now to the drawings for the purpose of illustrating the preferred embodiments of the invention and not for the purpose of limiting the same, FIG. 1 illustrates a self-tuning filter 101 of the present invention applied to a data acquisition application 100. The self-tuning filter 100 includes a frequency matching circuit 106 and a clock-tunable filter 104.

As applied to the data acquisition application depicted in FIG. 1, the self-tuning filter 101 is coupled to an input signal 102 provided by a sensor 103 and a data acquisition device 112. The input signal 102 is coupled to a signal input terminal (Sig) 120 of the clock-tunable filter 104. A frequency matching circuit 106 provides a filter control signal 108 to the clock-tunable filter 104. The filter control signal 108 is coupled to an operating frequency terminal (Con) 122 of the clock-tunable filter 104. A filtered signal 110 is incident at an output terminal (Out) 123 of the clock-tunable filter 104. The filtered signal 110 is coupled to an input (not shown) of the data acquisition device 112. The filtered signal is read by the data acquisition device 112 and may serve any of a number of purposes including, for example, logging of the filtered signal or manipulation of output devices (not shown) in response to the filtered signal 110. A sampling frequency signal 114 is generated by the data acquisition device 112 in the present example and coupled to the frequency matching circuit 106.

The input signal 102 may be an analog signal emanating from a sensor (not shown) such as, for example, a speed sensor, an acceleration sensor, a pressure sensor, a temperature sensor, a flow sensor, a humidity sensor, or a shaft position sensor. The shaft position sensor may, for example, sense the position of a generator shaft or a cam shaft in an automotive application. The sensor may provide an input signal which may, for example, be a current, voltage, or resistance and which adjusts in relation to the sensed phenomenon. Thus, if the sensor is a flow sensor sensing the flow of fuel into a cylinder of an engine, for example, a 1 V signal may be provided from the sensor at a flow rate of 10 milliliters per minute and a 5 V signal may be provided at a flow rate of 100 milliliters per minute or signals between 10 and 100 milliliters per minute may be proportionate between 4 and 20mA. The input signal may be coupled from the sensor to the clock-tunable filter 104 by, for example, copper conductors.

The sampling frequency signal 114 may be provided by any digital signal operating at the sampling frequency. Thus, the sampling frequency signal 114 may be internally clocked from within the data acquisition device 112 or externally clocked from a device external to a data acquisition device 112. An example of a sampling frequency signal that is externally clocked is an engine encoder 124 that provides a change of state each time an engine shaft 126 rotates a predetermined number of degrees. The signal from such an engine encoder 124 may be utilized to trigger data sampling as well as providing an input to the self-tuning filter of the present invention.

An example of an internally clocked sampling frequency signal is a signal produced by a sampling clock (not shown) internal to a data acquisition device 112. The sampling clock, in such a case, provides a digital output that controls the sampling rate of the data acquisition device 112. The digital output of such a sampling clock changes state at the sampling rate and each input controlled by the digital output is sampled when the digital output changes to a predetermined state, such as a high value. Thus, a sensed value may be incident at the input continuously and the input may read the sensed value each time the digital output of either an internally or externally clocked device changes to the predetermined state. The value read at the input may then be placed in a buffer where it may be accessed by the data acquisition device 112. Each time the predetermined state is achieved, the input may read the new value incident at the input and place that updated value in the buffer.

The digital output of the sampling clock is also used, in the present example, to provide the sampling frequency signal 114 to the frequency matching circuit 106. The frequency matching circuit 106 matches the sampling frequency to the clocking frequency required by the clock-tunable filter 104. That matching is accomplished by multiplying the frequency of the sampling frequency signal 114 by a factor. That factor is furthermore established by reference to the operating characteristics of the particular clock-tunable filter 104 utilized. The frequency matching circuit 106 in one embodiment of the present example includes a phase-lock loop, which multiplies the sampling frequency signal 114 and provides a filter control signal 108 to the operating frequency terminal (Con) 122. Thus, the frequency provided to the operating frequency terminal (Con) 122 is proportionate to the sampling frequency of the data acquisition device 112.

Figure 2:
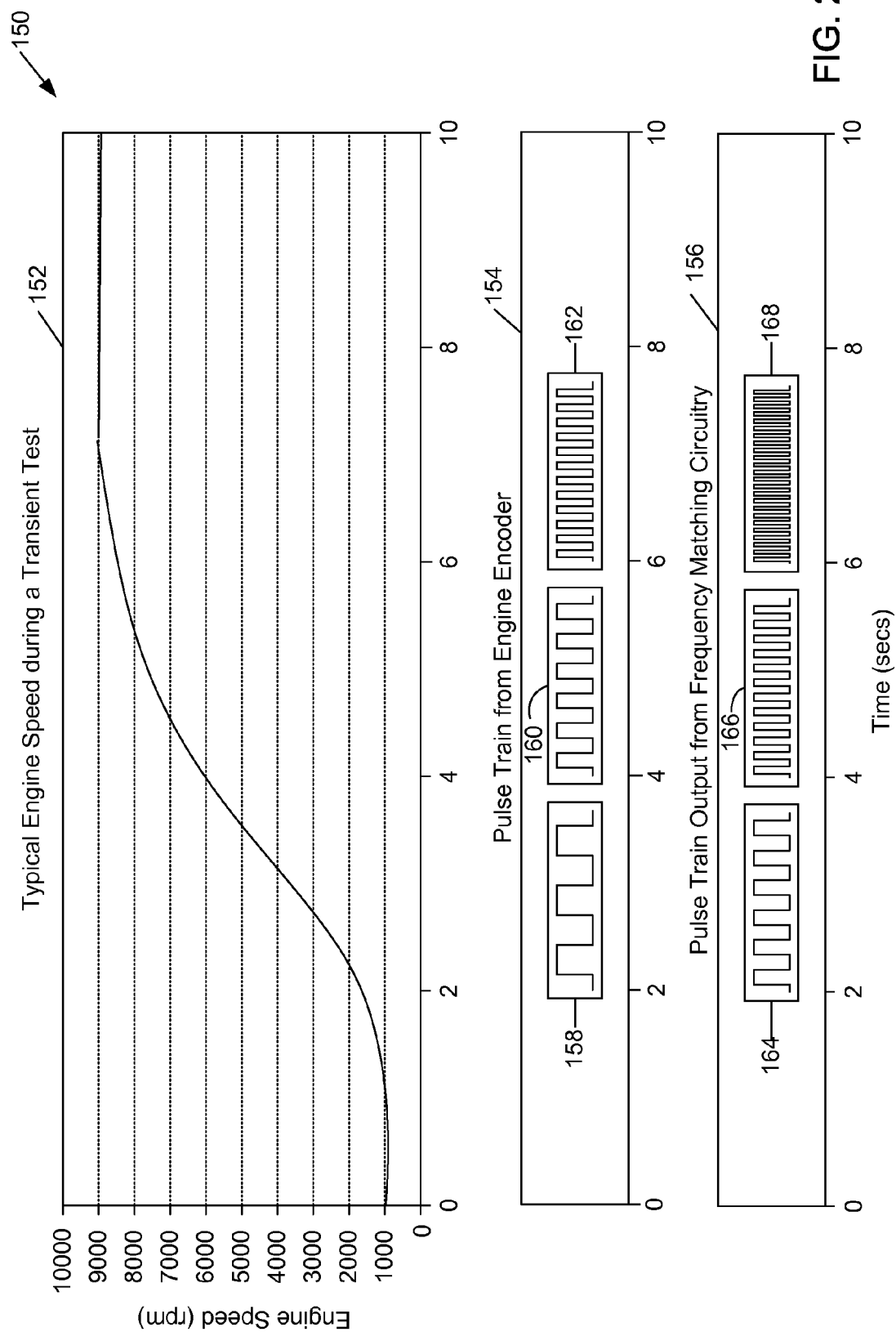
FIG. 2 is a set of charts illustrating engine encoder and frequency matching circuitry output at various engine speeds in an embodiment of the present invention.

FIG. 2 is a set of charts 150 illustrating engine encoder output 154 and frequency matching circuitry output 156 at various engine speeds in an embodiment of the present invention. The engine speed chart 152 illustrates an engine accelerating from 1000 rpm to 9000 rpm over a ten second period.

The engine encoder pulse train chart 154 illustrates a typical engine encoder pulse train corresponding to the two second point of the engine speed chart, an engine encoder pulse train corresponding to the four second point of the engine speed chart, and an engine encoder pulse train corresponding to the six second point of the engine speed chart. The engine encoder pulse train corresponding to the two second point is depicted at 158, the engine encoder pulse train corresponding to the four second point is depicted at 160, and the engine encoder pulse train corresponding to the six second point is depicted at 162, and those depictions are not illustrated to scale. One form of the engine encoder 124, which is utilized in the present example, provides a pulse for every degree of engine rotation. Other engine encoders 124 may provide, for example, a pulse for every half degree of rotation or a pulse for every tenth of a degree of rotation. Thus, in the present example wherein the engine encoder 124 provides a single pulse for every degree of rotation, a total of 360 pulses are output by the engine encoder 124 for every rotation of the engine. Engine encoder pulse train output may be calculated from engine speed such that the pulse train output for any given engine speed may be determined. Engine speed in rpm may, therefore, be divided by 60 seconds per minute to arrive at engine speed per second. Engine speed per second may then be multiplied by the number of encoder pulses per revolution (in this example, 360 pulses per rotation) to arrive at the engine encoder pulse train in cycles per second or hertz. Engine encoder pulse train for an engine encoder providing a pulse for every one degree of rotation is equal to $360/60$ or six times engine speed in rpm.

Utilizing that equation, engine encoder pulse train output at the two second mark on the engine speed chart 152, when the engine is operating at 1500 rpm, is equal to 9000 Hz. Engine encoder pulse train at the four second mark on the engine speed chart 152, when the engine is operating at 6000 rpm, is equal to 36,000 Hz, and engine encoder pulse train at the six second mark on the engine speed chart 152, when the engine is operating at 8500 rpm, is equal to 51,000 Hz.

The frequency matching circuitry pulse train chart 156 illustrates a pulse train output of one embodiment of the frequency matching circuitry corresponding to the two second point of the engine speed chart, a pulse train output corresponding to the four second point of the engine speed chart, and a pulse train output corresponding to the six second point of the engine speed chart. The two second frequency matching circuitry pulse train is depicted at 164, the four second frequency matching circuitry pulse train is depicted at 166, and the six second frequency matching circuitry pulse train is depicted at 168, and those depictions are not illustrated to scale. A form of frequency matching circuitry 106 utilized in the present example, provides 56 pulses for every engine encoder pulse or a frequency of 56 times that of the engine encoder. Other multipliers may also be used through the frequency matching circuitry as desired. For example, various multipliers may be employed to match the filter or other hardware utilized. Thus, in the present example wherein the frequency matching circuitry 106 provides 56 pulses for every engine encoder pulse, at the two second point when the engine encoder pulse train is 9000 Hz or 9 kHz, the pulse train output by the frequency matching circuitry 106 is 56 times 9 kHz, or 504 kHz. At the four second point, when the engine encoder pulse train is 36 kHz, the pulse train output by the frequency matching circuitry 106 is 56 times 36 kHz, or 2016 kHz, and at the six second point, when the engine encoder pulse train is 51 kHz, the pulse train output by the frequency matching circuitry 106 is 56 times 51 kHz, or 2856 kHz.

The present invention provides a corner frequency of approximately one-half the sampling frequency and provides a constant delay between receipt of a signal at the filter and output of the filtered signal from the filter to the data acquisition device of approximately one sample. In the following embodiment, the clock-tunable filter 104 is selected to have a clock to cut-off frequency ratio of 100. The clock-tunable filter 104 also has a group delay of 0.028 ms at a corner frequency of 20 kHz. Moreover, the ratio of group delay to corner frequency is constant such that group delay may be calculated for any corner frequency.

Figure 3:
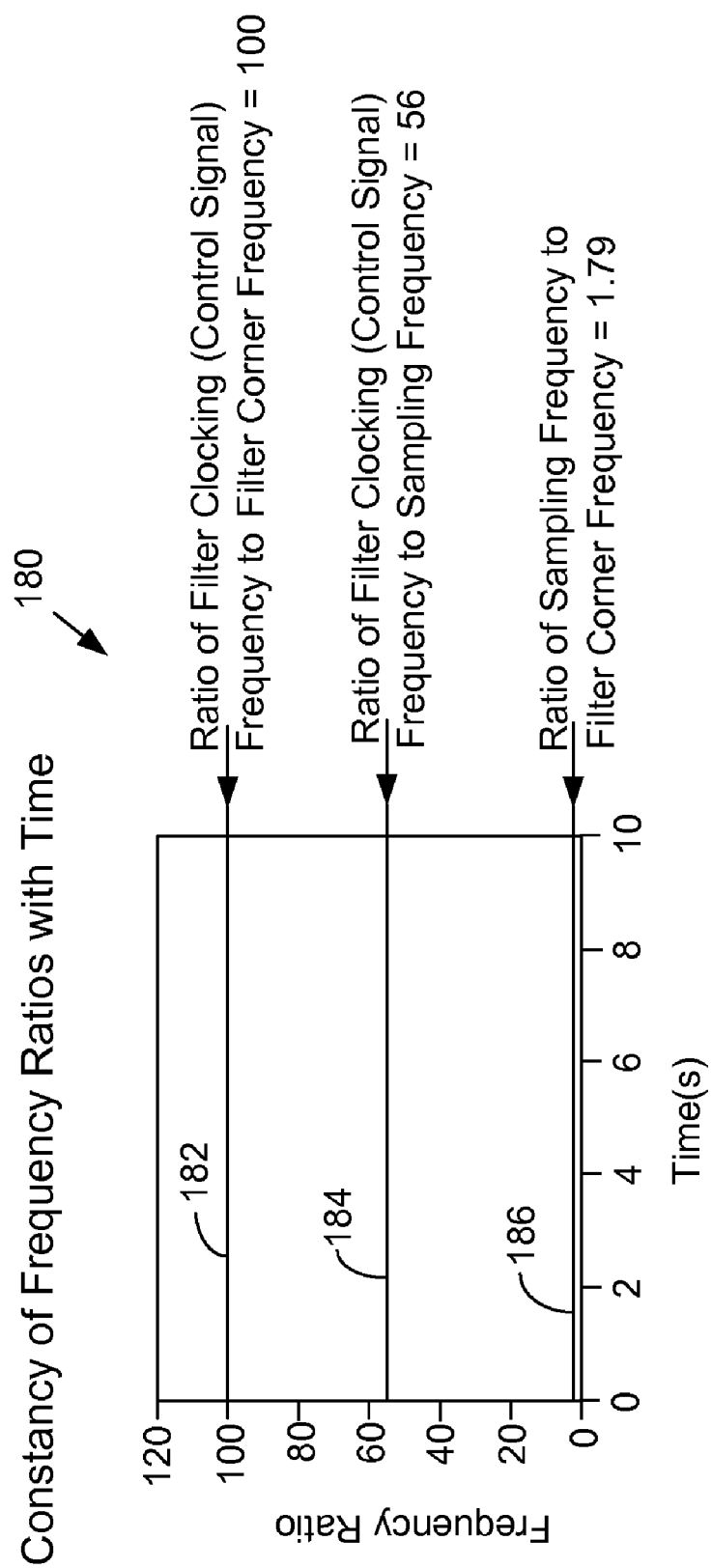
FIG. 3 is a chart illustrating a ratio of sampling frequency to filter corner frequency.

FIG. 3 is a chart 180 that illustrates the constancy of frequency ratios with time to maintain the ratio of sampling frequency to filter corner frequency at a constant of near two, thereby achieving a filter corner frequency that is equal to approximately half the sampling frequency across the range of sampling frequencies experienced. In the embodiment illustrated, the ratio of filter control signal frequency to filter corner frequency is 100, as shown at 182. Filter control signal frequency is 100 times the filter corner frequency because filter control signal frequency is input into the clock-tunable filter 104 and is, therefore, divided by the clock to cut-off frequency ratio of 100 to arrive at the corner frequency. The ratio of filter control signal frequency to sampling frequency is 56, as shown at 184. The ratio of filter control signal frequency to sampling frequency is accomplished because the frequency matching circuit 106 multiplies the sampling frequency 114 by 56 and outputs that frequency as the filter control signal 108. The ratio of sampling frequency to filter corner frequency is, therefore, equal to the ratio of filter control signal frequency to filter corner frequency divided by the ratio of filter control signal frequency to sampling frequency. Thus, in the present embodiment, the ratio of sampling frequency to filter corner frequency is 100 divided by 56, or 1.79, as shown at 186.

Clock-tunable filters 104 are available having clock to cut-off frequency ratios of values other than 100, including for example 50. Such clock-tunable filter 104 may be utilized with various frequency matching circuits to create other filter control circuits having a frequency that is approximately half the cut-off frequency ratio.

Thus, for example, with an engine speed of 6000 rpm with an encoder causing the data acquisition device to sample once for every degree of engine rotation, the sampling frequency is 6000 rpm times 360 samples/rotation divided by 60 sec/min=36 kHz. Utilizing frequency matching circuitry that provides 56 filter control signal pulses per sample, the ratio of filter control signal frequency to sampling frequency is fifty-six to one. The frequency of the filter control signal 108, at a sampling frequency of 36 kHz, is 36 kHz times 56, or 2016 kHz.

The filter delay or group delay is the time that a signal is delayed in getting to the data acquisition device due to the filter. A desirable filter delay value is one sampling cycle.

The clock-tunable filter selected for the present embodiment is a commercially available model LTC 1066-1, manufactured by Linear Technology of Milpitas Calif. That filter has a filter delay of 0.028 ms at 20 kHz. A filter having a filter delay of 0.028 ms at 20 kHz does not provide a perfect half cycle corner frequency but that commercially available component gives close to the desired half cycle corner frequency. A perfect half cycle corner frequency, in the present configuration would require a filter having a filter delay of 0.025 ms at 20 kHz.

The selected clock-tunable filter does, however, provide the desired one sample delay at all desired frequencies. Thus, at a corner frequency of 20 kHz, the sampling frequency would be equal to the control signal frequency of 20 kHz divided by the frequency matching circuit multiplier of 56 times the clock to cut-off frequency ratio of 100, or 35.7 kHz. The 35.7 kHz sampling frequency occurs at an engine speed of 5,950 rpm (35.7 kHz times 360 pulses per rotation divided by 60 sec/min). Moreover, the time between samples is equal to ⅟35.7 kHz, or 0.028 ms. Thus, as desired, the filter delay of 0.028 ms is equal to the time between samples and the invention achieves the desired one sample delay time. Furthermore, the sample delay time holds true for all engine speeds.

Thus, at 1500 rpm with a sampling rate of 9 kHz, the ideal filter delay of one divided by nine thousand or 0.111 ms is achieved. Similarly, the ideal filter delay at 9000 rpm of one divided by fifty-one thousand, or 0.0198 ms and at 6000 rpm the ideal filter delay of one divided by thirty-six thousand, or 0.0277 is achieved.

Figure 4:
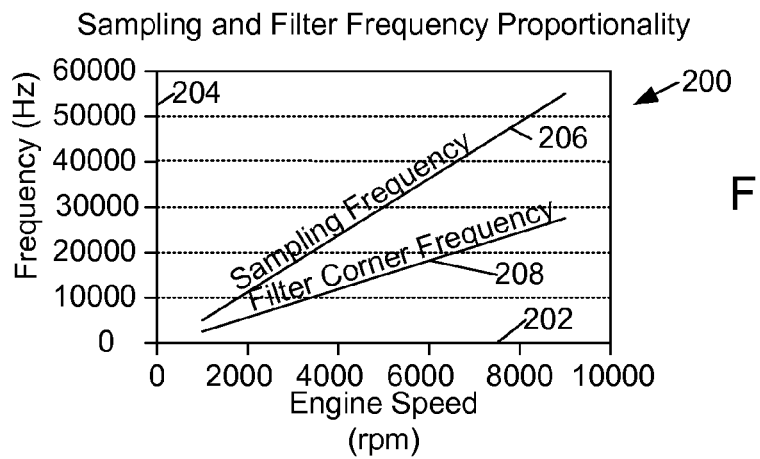
FIG. 4 is a chart illustrating sampling frequency and filter corner frequency associated with various engine speeds in the embodiment of FIG. 2.

The 35.7 kHz sampling frequency is equal to 1.79 times the corner frequency of 20 kHz. Therefore, the desired ratio of sampling frequency to filter corner frequency of approximately two is also achieved. The proportionality of sampling frequency to filter corner frequency across engine speeds of 1000 rpm to 9000 rpm is illustrated in FIG. 4. The sampling and filter frequency proportionality chart 200 of FIG. 4 depicts frequency in Hz on a vertical axis 204, engine speed in rpm on a horizontal axis 202, sampling frequency at various engine speeds 206 and filter corner frequency at various speeds 208.

Figure 5:
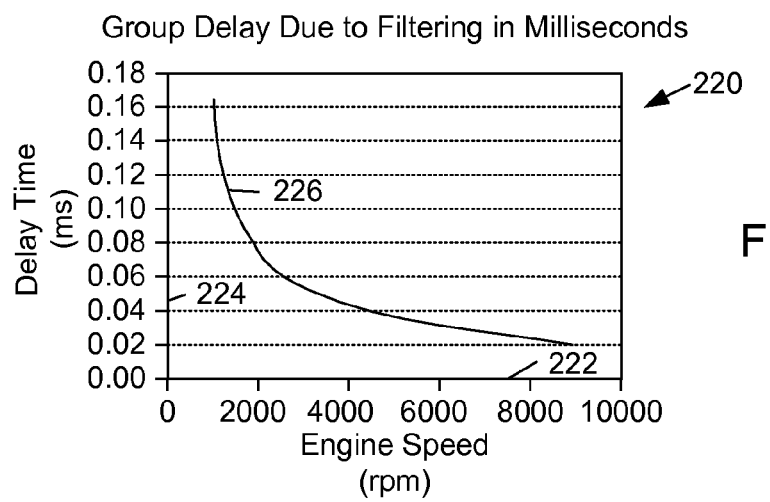
FIG. 5 is a chart illustrating filtering delay time associated with various engine speeds in the embodiment of FIGS. 2 and 4.

FIG. 5 illustrates a group or filter delay of the clock-tunable filter at various engine speeds in this embodiment. The group or filter delay is depicted at 226 on group delay chart 220 having a vertical axis 224 demarked in milliseconds of delay time and a horizontal axis 222 demarked in engine speed rpm.

Figure 6:
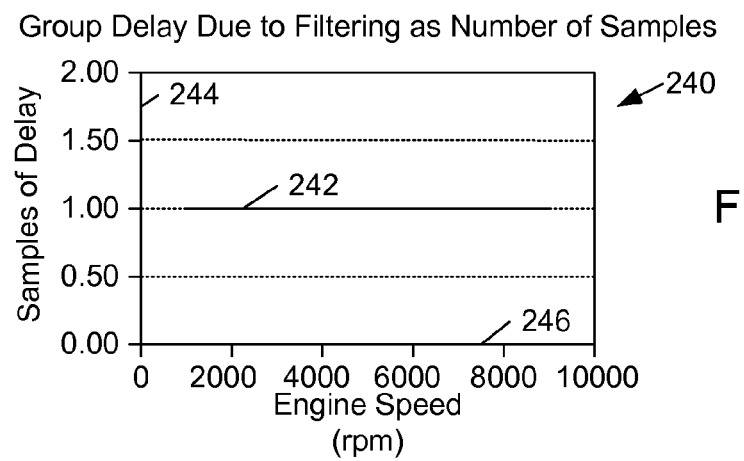
FIG. 6 is a chart illustrating filter delay in samples associated with various engine speeds in the embodiments of FIGS. 2, 4 and 5.

FIG. 6 is a chart 240 illustrating that the delay time in a sample reaching the data acquisition device 112 due to the self-tuning filter 101 is equal to one sample at all engine speeds. The group delay due to the self-tuning filter 101 is illustrated by line 242 and is equal to one sample of delay, demarked on the vertical axis 244 at various engine speeds demarked on the horizontal axis 246. Thus, another goal of achieving a constant filter delay in a system having a variable sampling rate is also achieved.

Figure 7:
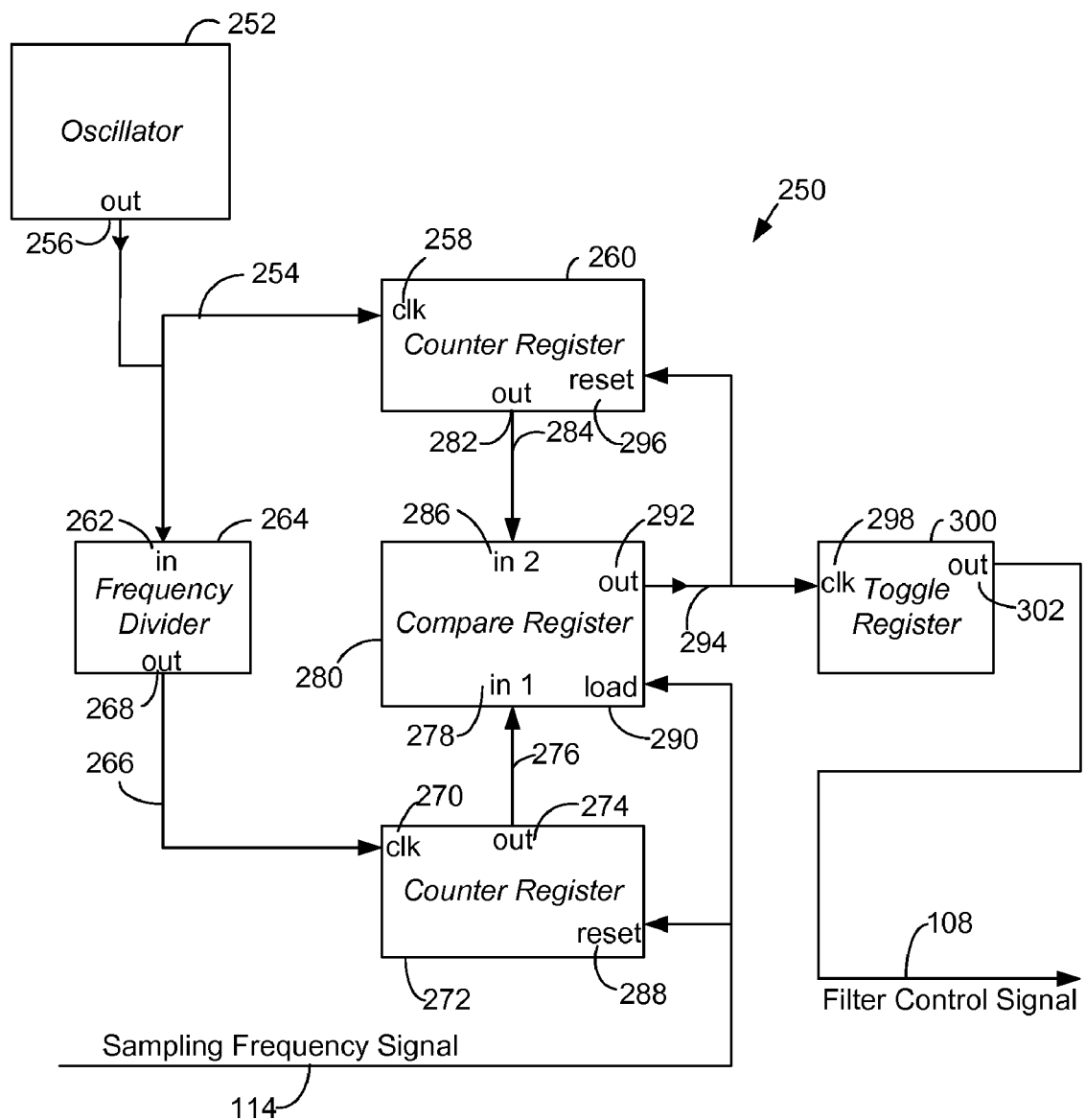
FIG. 7 is a schematic illustration of a digital frequency multiplier of the present invention.

FIG. 7 illustrates a digital frequency multiplier 250 included in the frequency matching circuit 106 in another embodiment of the present invention. It will be noted that the digital frequency multiplier 250 described hereinbefore multiplied the sampling frequency by fifty-six while the digital frequency multiplier 250 described in connection with FIG. 7 multiplies the sampling frequency by 10. These and other multipliers may be used with various embodiments of the present invention.

In operation with the sampling frequency signal 114 operating for the duration of the current example at 1000 Hz, a first counter register 260 will count low to high transitions on the oscillator 252 output (out) 256 clocking signal 254, which is operating at 1 MHz. A second counter register 272 will count low to high transitions on a scaled oscillator signal 266 received from an output (out) 268 of a frequency divider 264, which is operating at 100 kHz until the second counter register 272 is reset at 288 by a low to high transition of the sampling frequency signal 114. In the present example, a compare register 280 will have a value of 100 at its input terminal (in1) 278. That value of 100 is equal to the number of low to high transitions received at a clock terminal (clk) 270 of the second counter register 272 between individual low to high transitions of the sampling frequency signal 114, i.e., 100 kHz divided by 1000 Hz, or a count of 100. The compare register 280 will furthermore transition its output from low to high each time the count signal 284 received from the output (out) 282 of the first counter register 260 at its input (in2) 286 reaches a value equal to the value of a signal 276 received from an output (out) 274 of the second counter register 272 at its other input (in1) 278. Thus, the compare register output (out) 292 will transition each time the count at input (in2) 286 reaches 100 in the present example. Because the frequency of the signal 254 provided to the clock terminal (clk) 258 of the first counter register 260 is ten times greater than the frequency of the signal 266 provided to the clock terminal (clk) 270 of the second counter register 272, a compare register output (out) 292 will transition ten times for each transition of the sampling frequency signal 114 received at a load terminal 290. When the compare register output (out) 292 transitions, the output signal 294 of the compare register 280 will reset the first counter register 260 at 296 and trigger a toggle register 300 at 298. The toggle register 300 then provides a filter control signal 108 at output (out) 302 that operates at a frequency ten times greater than that of the sampling frequency signal 114. It will be recognized that the filter control signal 108 provided to the clock-tunable filter 104 may be set to operate at a frequency that may be any desired multiple of the sampling frequency signal 114 by selecting a frequency divider 264 that divides the oscillator clocking signal 254 received at input (in) 262 by the desired multiple.

The embodiments of the invention lend several important features to the design of a filter for a signal having a changing sampling rate: (i) the filter frequency may always be set in direct proportion to the sampling frequency; (ii) the signal delay may always be set to a fixed number of samples, and can be arranged to be a single sample point delay if the filter frequency is set at an appropriate value; and (iii) the system is capable of following any sampling rate set by the system without external intervention.

The present invention produces a very adaptable anti-aliasing filter system for high-speed data acquisition where there is little or no communication with the host computer and yet the filter is always set to the most suitable condition. The application of this idea may be universally applied to any data acquisition application in which an anti-aliasing hardware filter is required or desired to ensure accurate logging of data and subsequent software filtering.

While the invention has been described in detail and with reference to specific embodiments thereof, it will be apparent to one skilled in the art that various changes and modifications can be made therein without departing from the spirit and scope thereof. In particular, it should be noted that the present invention provides a filter having a frequency that will adjust to any sampling signal including signal operating at a constant sampling rate and a signal operating at a variable sampling rate. Thus, the present invention also beneficially provides a filter that may be used in a constant sampling application without requiring manual set-up by an operator. Thus, it is intended that the present invention cover modifications and variations of this invention provided that they come within the scope of the appended claims and their equivalents.

What is claimed is:

1. A data acquisition apparatus, comprising:
   an input to be coupled to a sensed signal, said input triggered to sample the sensed signal when a digital clocking signal, operating at a varying rate, changes to a predetermined state; and
   a clock-tunable filter coupled to said digital clocking signal and said input, wherein the frequency of the clock-tunable filter is maintained at a ratio of the frequency at which the digital clocking signal changes to the predetermined state.

2. The data acquisition apparatus of claim 1, wherein the clock-tunable filter is a low-pass filter.

3. The data acquisition apparatus of claim 1, further comprising a frequency multiplier coupled to said digital clocking signal and said clock-tunable filter, whereby the frequency of the clock-tunable filter is a multiple of the frequency at which the digital clocking signal changes to the predetermined state.

4. The data acquisition apparatus of claim 3, wherein the frequency multiplier is a phase-lock loop.

5. The data acquisition apparatus of claim 1, wherein the input is coupled to the sensed signal through the clock-tunable filter.

6. The data acquisition apparatus of claim 1, wherein a sampling frequency at which the digital clocking signal operates is equal to the frequency at which the digital clocking signal changes to the predetermined state.

7. The data acquisition apparatus of claim 1, wherein the sensed signal originates at a sensor.

8. The data acquisition apparatus of claim 7, wherein the sensor provides an analog signal.

9. The data acquisition apparatus of claim 1, wherein the frequency at which the digital clocking signal changes to the predetermined state varies as a function of a degree of rotation of a shaft.

10. A data acquisition apparatus, comprising:
    an input to be coupled to a sensed signal, said input triggered to sample the sensed signal when a digital clocking signal changes to a predetermined state; and
    a clock-tunable filter coupled to said digital clocking signal and said input, wherein a frequency of the clock-tunable filter is maintained at a ratio of the frequency at which the digital clocking signal changes to the predetermined state.

11. The data acquisition apparatus of claim 10, wherein the clock-tunable filter is a low-pass filter.

12. The data acquisition apparatus of claim 10, further comprising a frequency multiplier coupled to said digital clocking signal and said clock-tunable filter, wherein the frequency of the clock tunable filter is a multiple of the frequency at which the digital clocking signal changes to the predetermined state.

13. The data acquisition apparatus of claim 12, wherein the frequency multiplier is a phase-lock loop.

14. The data acquisition apparatus of claim 10, wherein the frequency at which the digital clocking signal changes to the predetermined state is equal to a sampling frequency at which the sensed signal is sampled.

15. The data acquisition apparatus of claim 10, wherein the sensed signal originates at a sensor.

16. The data acquisition apparatus of claim 15, wherein the sensor provides an analog signal.

17. The data acquisition apparatus of claim 10, wherein the frequency at which the digital clocking signal changes to the predetermined state varies.

18. The data acquisition apparatus of claim 17, wherein the frequency at which the digital clocking signal changes to the predetermined state varies as a function of a degree of rotation of a shaft.

19. The data acquisition apparatus of claim 10, wherein the input is coupled to the sensed signal through the clock-tunable filter.

20. A data acquisition apparatus, comprising:
    a digital clocking signal;
    an input coupled to said digital clocking signal, wherein the input reads a value on the input when the digital clocking signal changes to a predetermined state and the digital clocking signal changes to the predetermined state at a varying rate;
    a phase-lock loop coupled to said digital clocking signal; and
    a clock-tunable filter coupled to said phase-lock loop, wherein the frequency of the clock-tunable filter is a multiple of a sampling frequency at which the digital clocking signal changes to the predetermined state.

* * * * *